(12) United States Patent  (10) Patent No.: US 6,603,337 B2
Cho  (45) Date of Patent: Aug. 5, 2003

(54) DUTY CYCLE CORRECTION CIRCUIT

(75) Inventor: Seong Ik Cho, Cheollabuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/035,082

(22) Filed: Dec. 28, 2001

(65) Prior Publication Data

US 2002/0084818 A1 Jul. 4, 2002

(30) Foreign Application Priority Data

Dec. 29, 2000 (KR) ........................................ 2000-85580

(51) Int. Cl.[7] ................................................ H03L 7/06
(52) U.S. Cl. ........................ 327/149; 327/158; 327/161
(58) Field of Search .................................. 327/175, 148, 327/149, 150, 158, 159, 161

(56) References Cited

U.S. PATENT DOCUMENTS

| | | | | |
|---|---|---|---|---|
| 5,216,302 A | * | 6/1993 | Tanizawa | 327/1 |
| 5,410,263 A | * | 4/1995 | Waizman | 327/141 |
| 5,463,337 A | * | 10/1995 | Leonowich | 327/113 |
| 5,974,560 A | * | 10/1999 | Hotta et al. | 713/500 |
| 6,150,855 A | * | 11/2000 | Marbot | 327/116 |
| 6,295,328 B1 | * | 9/2001 | Kim et al. | 327/116 |
| 6,441,659 B1 | * | 8/2002 | Demone | 327/149 |

* cited by examiner

Primary Examiner—Tuan T. Lam
(74) Attorney, Agent, or Firm—Ladas & Parry

(57) ABSTRACT

A duty cycle correction circuit for a semiconductor memory device capable of exchanging data on both edges of rising and falling of clock by correcting duty error of input clock signal, including a phase detection unit for receiving input clock signals and reference clock signals to generate a phase difference detection signal comparing phase difference; loop filter unit for converting the phase difference detection signal into a voltage signal and outputting the result; multi phase signal generation unit for generating a clock signal having a plurality of phase differences by controlling the delay time of the input clock signal and then, selecting and outputting one clock signal by comparison with the voltage signal; and a duty correction unit for receiving the input clock signal and the clock signal outputted from the multi phase signal generation unit and logically combining them to correct duty of the input clock signal.

10 Claims, 3 Drawing Sheets

DUTY CYCLE CORRECTION CIRCUIT

BACKGROUND OF THE INVENTION

1. Field of the Invention

The present invention relates generally to a duty cycle correction circuit and, more particularly, to a duty cycle correction circuit correcting a duty of a clock input signal so as to exchange data on both edges of rising and falling of clock.

2. Description of the Related Art

Generally, a clock signal is employed as a basic signal in processing signals of a semiconductor integrated circuit and of other electronic circuits. In a semiconductor memory device, the clock signal includes an external clock signal inputted from the exterior of the semiconductor memory device and an internal clock signal employed in the interior of the semiconductor memory device. The difference between the external clock signal and the internal clock signal is referred to herein as a duty rate or a duty.

As a conventional semiconductor memory device, DRAM inputs and outputs data on a rising edge of a clock signal. However, it is desirable to exchange data on both edges of a clock signal, that is, on both the rising and falling edges, in order to improve a data transmission rate.

However, in the conventional semiconductor memory device, the external clock signal, inputted from the exterior, is inputted with duty errors (40:60 or 60:40). Therefore, there is a problem that it is difficult to exchange data on both the rising and falling edges of a clock signal.

SUMMARY OF THE INVENTION

Therefore, the present invention has been made to solve the above-mentioned problems and an object of the present invention is to provide a duty cycle correction circuit capable of exchanging data on both rising and falling edges of a clock signal by correcting duty errors of the input clock signal by using a multi phase signal generator.

In order to accomplish the above object, the present invention comprises: a phase detection unit for receiving an input clock signal and a reference clock signal to generate a phase difference detection signal comparing the phase difference; a loop filter unit for converting the phase difference detection signal into a voltage signal and outputting the inverted signal; a multi phase signal generation unit for generating a clock signal having a plurality of phase differences by controlling the delay time of the input clock signal and selecting and outputting one clock signal by means of a the voltage signal; and a duty correction unit for receiving the input clock signal and the clock signal outputted from the multi phase signal generation unit and logically combining then, to correct the duty of input clock signal.

When the reference clock signal has a phase difference of 360° with respect to the input clock signal, the multi phase signal generation unit generates 4 clock signals respectively having phase differences of 90 ° if the phase of the input clock signal corresponds with that of the reference clock signal.

When the reference clock signal has a phase difference of 720° with respect to the input clock signal, the multi phase signal generation unit generates 8 clock signals respectively having phase differences of 90° if the phase of the input clock signal corresponds with that of the reference clock signal.

The multi phase signal generation unit comprises: a first phase signal generation unit for generating, by means of the voltage signal, a first clock signal having a phase of 90° with respect to the input clock signal; a second phase signal generation unit for generating, by means of the voltage signal, a second clock signal having a phase of 180° with the input clock signal by controlling the delay of the first clock signal; a third phase signal generation unit for generating, by means of the voltage signal, a third clock signal having a phase of 270° with the input clock signal by controlling the delay of the second clock signal; and a fourth phase signal generation unit for generating, by means of the voltage signal, a clock signal having a phase of 360° with the input clock signal by controlling the delay of the third clock signal.

The duty correction unit comprises: a first frequency division unit for receiving a clock signal from the multi phase signal generation unit as its clock input signal and its output signal as an input signal to generate a two-frequency divided signal of the clock signal; a second frequency division unit for receiving the input clock signal as a clock input signal and its output signal as an input signal to generate a two-frequency divided signal of the input clock signal; and a logic operation unit for receiving the two signals respectively of the two-frequency divided signal generated by the first frequency division unit and the second frequency division unit to generate an exclusive OR logic operated signal.

The first frequency division unit comprises a first D-flip flop and a first inverter for receiving the output signal of the first D-flip flop and outputting the inverted signal.

The second frequency division unit comprises a second D-flip flop and a second inverter for receiving the output signal of the second D-flip flop and outputting the inverted signal.

The logic operation unit comprises an exclusive OR gate.

DETAILED DESCRIPTION OF THE INVENTION

The above objects, and other features and advantages of the present invention will become more apparent after reading the following detailed description when taken in conjunction with the accompanying drawings.

Figure 1:
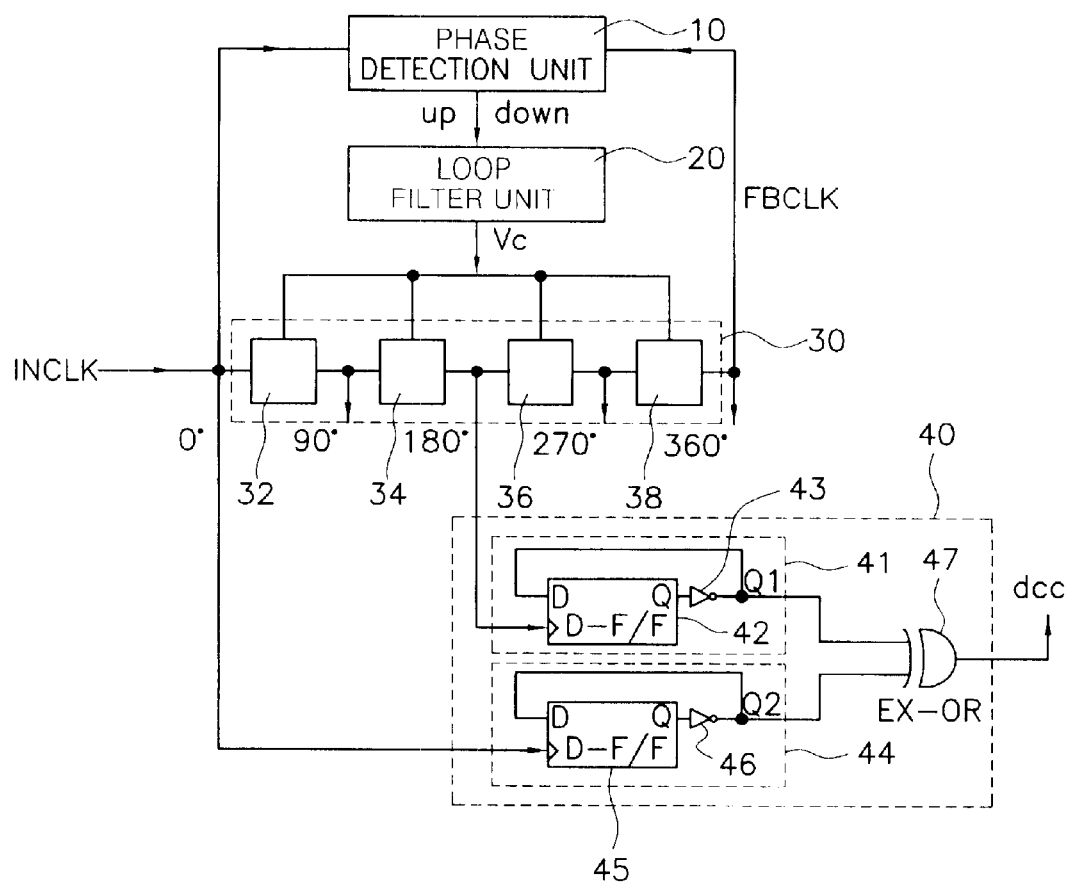
FIG. 1 is a circuit diagram of a duty cycle correction circuit according to the present invention.

FIG. 1 is a block circuit diagram of a duty cycle correction circuit according to an embodiment of the present invention, comprising a phase detection unit 10, a loop filter unit 20, a multi phase signal generation unit 30 and a duty correction unit 40.

The phase detection unit 10 receives an input clock signal INCLK having a phase of 0° and a reference clock signal FBCLK having a phase of 360° with respect to that of the input clock signal INCLK to generate UP/DOWN signals comparing the phase difference of the two signals.

The loop filter unit 20 receives the UP/DOWN signals outputted from the phase detection unit 10 to invert the phase difference of the UP/DOWN signals into a voltage signal Vc and to output the signal.

The multi phase signal generation unit 30 comprises first to fourth phase signal generation units 32, 34, 36, 38 for generating 4 clock signals respectively having a phase of 90° from the input clock signal INCLK by the voltage signal Vc outputted from the loop filter unit 20. The multi phase signal generation unit 30 selects and outputs that one of the 4 input clock signals IC having a phase of 90° by selecting that input clock signal (IC) that has a phase difference between the input clock signal INCLK having a phase of 0° and the reference clock signal FBCLK having a phase of 360° with respect to the input clock signal INCLK.

The first phase signal generation unit 32, by means of the voltage signal Vc, generates a clock signal having a phase of 90° with respect to the input clock signal INCLK having a phase of 0°. The second phase signal generation unit 34 generates, by means of the voltage signal Vc, a clock signal having a phase of 180° with respect to the input clock signal INCLK by controlling a delay of the clock signal generated in the first phase signal generation unit 32. The third phase signal generation unit 36 generates, by means of the voltage signal Vc, a clock signal having a phase of 270° with respect to the input clock signal INCLK by controlling the delay of the clock signal generated in the second phase signal generation unit 34. The fourth phase signal generation unit 38 generates, by means of the voltage signal Vc, a clock signal having a phase of 360° with respect to the input clock signal INCLK by controlling the delay of the clock signal generated in the third phase signal generation unit 36.

Therefore, the multi phase signal generation unit 30 generates 4 clock signals at phase differences of 90°, 180°, 270°, 360°, respectively, if a phase of the input clock signal INCLK having a phase of 0° corresponds with that of the clock signal FBCLK having a phase of 360° with the input clock signal INCLK since it comprises first to fourth phase signal generation units 32, 34, 36, 38. The multi phase signal generation unit 30 selects and outputs one of the 4 clock signals 90°, 180°, 270°, 360° according to the duty rate of the input clock signal INCLK.

Figure 3:
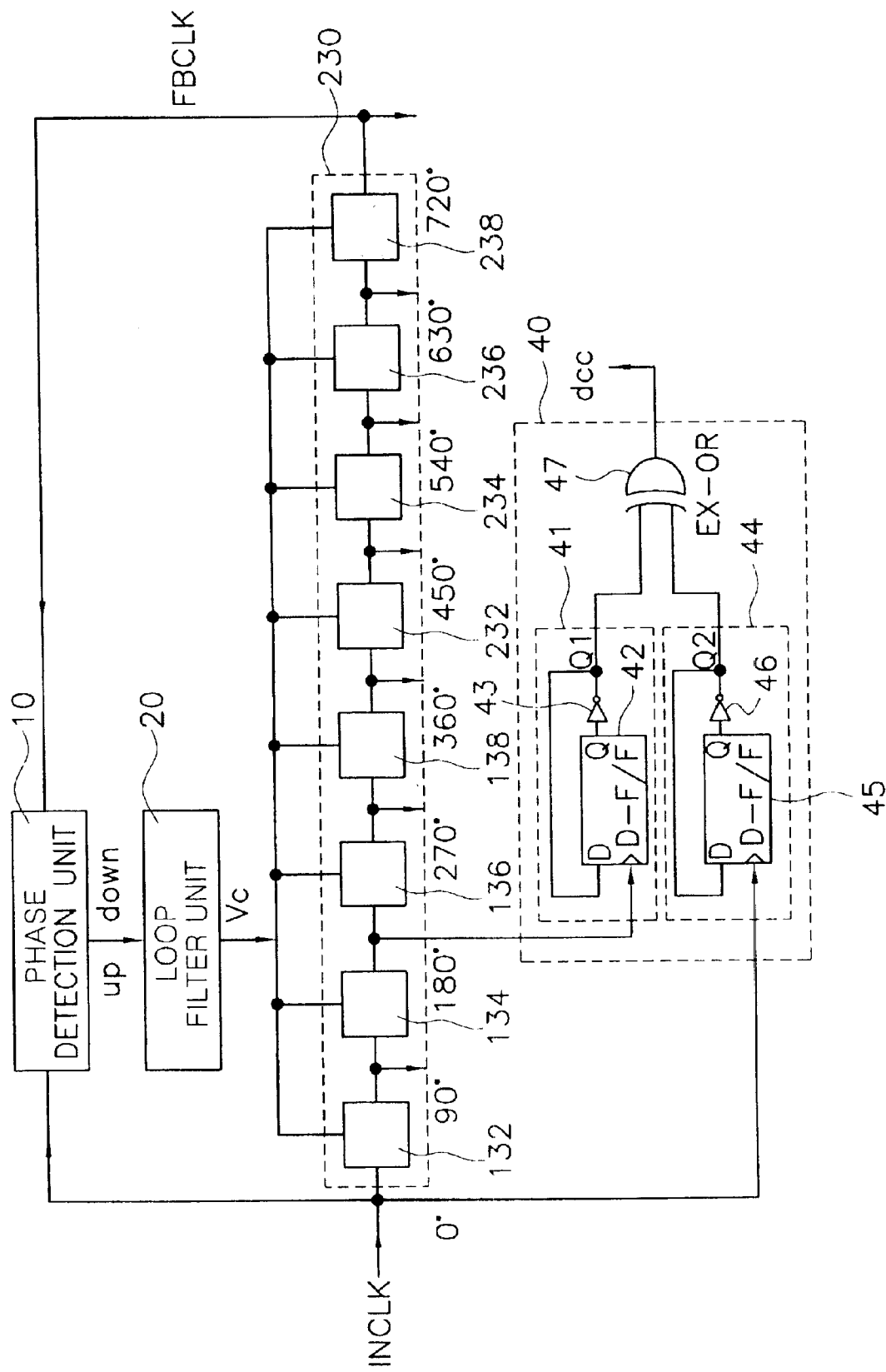
FIG. 3 is an alternative circuit diagram of a duty cycle correction circuit according to the present invention showing a multi phase signal generation generating eight clock signals.

When the reference clock signal has a phase difference of 720° with respect to the input clock signal, the multi phase signal generation unit generates 8 clock signals respectively having phase differences of 90° if the phase of the input clock signal corresponds with that of the reference clock signal Therefore, as shown in FIG. 3, the multi phase signal generation unit 230 generates 8 clock signals at phase differences of 90°, 180°, 270°, 360°, 450°, 540°, 630° and 720°, respectively, if a phase of the input clock signal INCLK having a phase of 0° corresponds with that of the clock signal FBCLK having a phase of 360° with the input clock signal INCLK since it comprises first to eighth phase signal generation units 132, 134, 136, 138, 232, 234, 236, and 238. The multi phase signal generation unit 130 selects and outputs one of the 8 clock signals 90°, 180°, 270°, 360°, 450°, 540°, 630° and 720° according to the duty rate of the input clock signal INCLK.

The duty correction unit 40 receives the input clock signal INCLK having a phase of 0° and the clock signal outputted from the multi phase signal generation unit 30 to generate a duty correction signal dcc of the input clock signal INCLK. In order to accomplish the above processes, the duty correction unit 40 comprises: a first frequency division unit 41 for receiving the clock signal 180° CLK outputted from the multi phase signal generation unit 30 as its clock signal CLK and its output signal Q1 as an input signal D to generate a two-frequency divided signal Q1 of the clock signal 180° CLK; a second frequency division unit 44 for receiving the input clock signal INCLK having a phase of 0° as a clock signal and its output signal Q2 as an input signal D to generate a two-frequency divided signal of the input clock signal INCLK; and an exclusive OR gate unit 47 for receiving the two signals Q1, Q2 respectively of the two-frequency divided signal in the first frequency division unit 41 and the second frequency division unit 44 to generate an exclusive OR logic operated signal dcc.

The first frequency division unit 41 comprises a D flip flop 42 and an inverter 43 for receiving an output signal Q of the D flip flop 42 to output the inverted signal Q1. The second frequency division unit 44 comprises a D flip flop 45 and an inverter 46 for receiving an output signal Q of the D flip flop 45 to output the inverted signal Q2.

The exclusive OR gate unit 47 comprises an exclusive OR gate, EX-OR, for receiving the two signals respectively of the two-frequency divided signals outputted by the first frequency division unit 41 and the second frequency division unit 44 and for generating an exclusive OR logic operated signal dcc. The signal dcc outputted from the exclusive OR gate unit 47 is a duty correction signal of the input clock signal INCLK.

Figure 2:
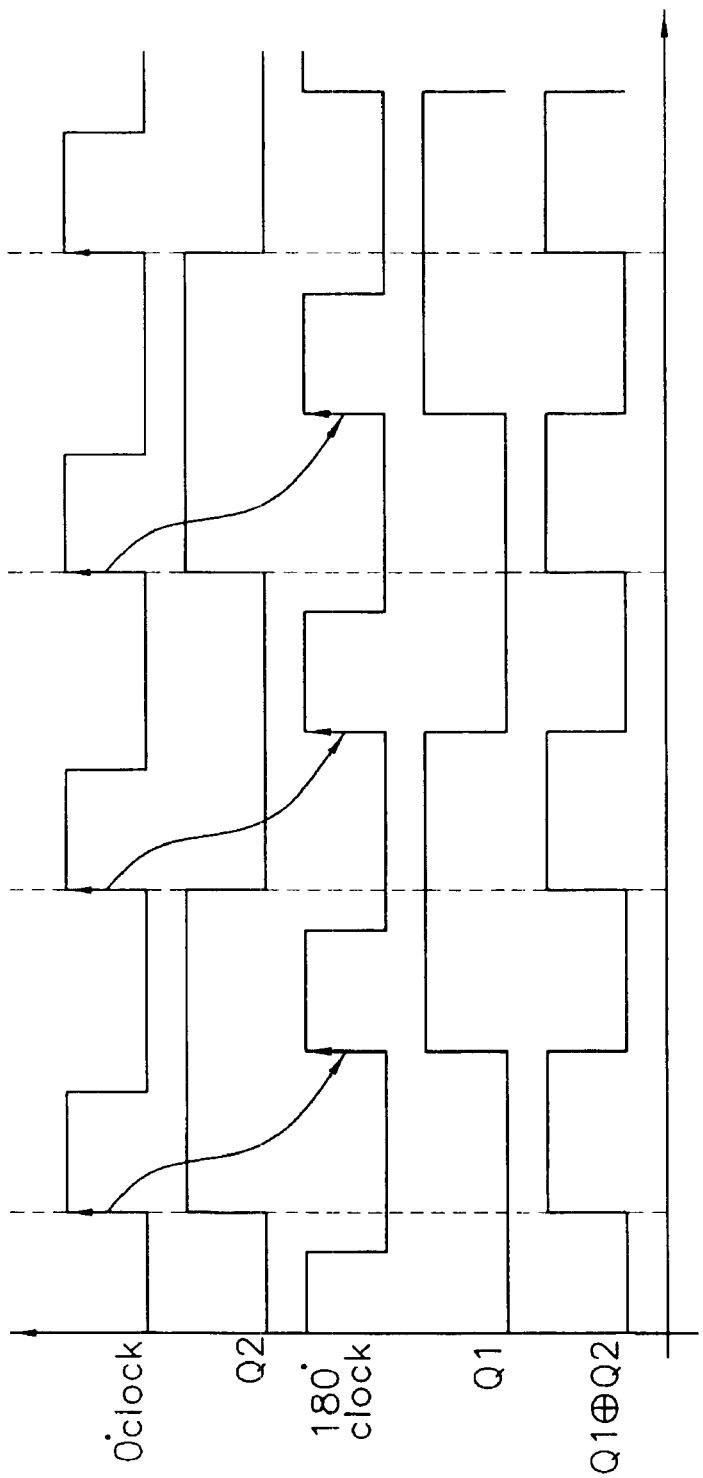
FIG. 2 is a drawing for showing operation timing of the duty cycle correction circuit of FIG. 1 according to the present invention.

FIG. 2 is a waveform diagram for showing an operation of the above-described duty cycle correction circuit according to the present invention.

First, the phase detection unit 10 generates UP/DOWN signals indicating a phase difference between an input clock signal INCLK having a phase of 0° and a reference clock signal FBCLK having a phase of 360° with the input clock signal INCLK.

The loop filter unit 20 receives the UP/DOWN signals generated in the phase detection unit 10 to invert it into a voltage signal Vc and output the signal.

Then, the multi phase signal generation unit 30 receives the voltage signal Vc outputted from the loop filter unit 20 and the input clock signal INCLK to select and output one of the four clock signals 90° CLK, 180° CLK, 270° CLK or 360° CLK having a phase difference of 90° with the input clock signal INCLK according to the voltage signal Vc. Here, the one clock signal selected by the voltage signal Vc is determined according to the duty of the input clock signal INCLK.

In FIG. 1, when a duty of the input clock signal INCLK is 40:60, a duty of the input clock signal INCLK is corrected by using a clock signal 180° CLK having a phase difference of one-half period (180°) with respect to the input clock signal INCLK. Here, the clock signal 180° CLK having a phase of one-half period (180°) with the input clock signal 0° CLK having a phase difference of 0° is shown in the timing diagram of FIG. 2.

The duty correction unit 40 is a circuit for correcting a duty of the input clock signal INCLK. The duty correction unit 40 receives the input clock signal INCLK and the clock signal 180° CLK outputted from the multi phase signal generation unit 30 to generate, respectively, a two-frequency divided signal and an exclusive OR logic operation of the two frequency divided signals, thereby correcting a duty of the input clock signal INCLK into the desired 50:50 relationship.

Therefore, a duty cycle correction circuit of the present invention selectively outputs one clock signal having a phase different from the input clock signal INCLK generated in the multi phase signal generation unit 30 according to a duty of the input clock signal INCLK and performs a logic operation with the input clock signal INCLK, thereby correcting a duty of the input clock signal INCLK.

According to the present invention, a duty of the input clock signal INCLK is detected by using a reference clock signal FBCLK having a phase difference of 360° with the input clock signal INCLK. However, according to another embodiment of the present invention, a duty of input clock signal INCLK can be detected by using a reference clock signal FBCLK having other phase differences with the input clock signal INCLK, thereby correcting a duty of input clock signal INCLK.

As described above, according to the duty cycle correction circuit of the present invention, a duty error of input clock signal is corrected by using a clock signal generated in a multi phase generator, thereby exchanging data on both rising and falling edges of the clock signal. It is also effective to improve the transmission rate of data in other electronic circuits using a phase difference.

Although the preferred embodiments of the invention have been disclosed for illustrative purposes, those skilled in the art will appreciate that various modifications, alterations, additions and substitutions are possible, without departing from the scope and spirit of the invention as disclosed in, and only limited by, the accompanying claims.

What is claimed is:

1. A duty cycle correction circuit comprising:
   a phase detection unit for receiving an input clock signal and a reference clock signal to generate a phase difference detection signal by comparing the phase difference;
   a loop filter unit for converting the phase difference detection signal into a voltage signal and outputting the result;
   a multi phase signal generation unit for generating at least four/clock signals, respectively, each having a phase difference of 90°, when the phase of the input clock signal corresponds with that of the reference clock signal, by controlling the delay time of the input clock signal with the voltage signal; and
   a duty correction unit for receiving the input clock signal and a clock signal outputted from the multi phase signal generation unit and logically combining then, to correct a duty of the input clock signal.

2. The duty cycle correction circuit according to claim 1, wherein the reference clock signal has a phase difference of 360° with respect to the input clock signal.

3. The duty cycle correction circuit according to claim 1, wherein the reference clock signal has a phase difference of 720° with respect to the input clock signal.

4. The duty cycle correction circuit according to claim 3, wherein the multi phase signal generation unit generates eight clock signals, respectively, each having a phase difference of 90° when the phase of the input clock signal corresponds with that of the reference clock signal.

5. The duty cycle correction circuit according to claim 1, wherein the multi phase signal generation unit comprises:
   a first phase signal generation unit for generating a first clock signal having a phase of 90° with respect to the input clock signal in response to the voltage signal;
   a second phase signal generation unit for generating a second clock signal having a phase of 180° with respect to the input clock signal by controlling the delay of the first clock signal by the voltage signal;
   a third phase signal generation unit for generating a third clock signal having a phase of 270° with respect to the input clock signal by controlling the delay of the second clock signal by the voltage signal; and
   a fourth phase signal generation unit for generating a clock signal having a phase of 360° with respect to the input clock signal by controlling the delay of the third clock signal by the voltage signal.

6. The duty cycle correction circuit according to claim 1, wherein the duty correction unit comprises:
   a first frequency division unit for receiving a clock signal from the multi phase signal generation unit as its clock input signal and its output signal as an input signal to generate a two-frequency divided signal of the clock signal;
   a second frequency division unit for receiving the input clock signal as a clock input signal and its output signal as an input signal to generate a two-frequency divided signal of the input clock signal; and
   a logic operation unit for receiving the two signals, respectively, that were two-frequency divided in the first frequency division unit and in the second frequency division unit to generate an exclusive OR logic operated signal.

7. The duty cycle correction unit according to claim 6, wherein the first frequency division unit comprises a first D-flip flop and a first inverter for receiving an output signal of the first D-flip flop to output the inverted signal.

8. The duty cycle correction circuit according to claim 6, wherein the second frequency division unit comprises a second D-flip flop and a second inverter for receiving an output signal of the second D-flip flop to output the inverted signal.

9. The duty cycle correction circuit according to claim 6, wherein the logic operation unit comprises an exclusive OR gate.

10. The duty cycle correction circuit according to claim 7, wherein the second frequency division unit comprises a second D-flip flop and a second inverter for receiving an output signal of the second D-flip flop to output the inverted signal.

* * * * *